US006623842B2

(12) United States Patent
Uchikoba et al.

(10) Patent No.: US 6,623,842 B2
(45) Date of Patent: Sep. 23, 2003

(54) SURFACE ELECTRODE STRUCTURE ON CERAMIC MULTI-LAYER SUBSTRATE AND PROCESS FOR PRODUCING THE SAME

(75) Inventors: Fumio Uchikoba, Tokyo (JP); Tomoyuki Goi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/956,011

(22) Filed: Sep. 20, 2001

(65) Prior Publication Data
US 2002/0058151 A1 May 16, 2002

(30) Foreign Application Priority Data
Sep. 21, 2000 (JP) .......................... 2000-286410

(51) Int. Cl.[7] .......................... B32B 7/00; B32B 15/00; H01L 41/053
(52) U.S. Cl. .................. 428/209; 428/689; 428/699; 428/672; 428/673; 428/680; 310/313 R; 310/313 B
(58) Field of Search .................. 428/632, 545, 428/209, 655, 668, 672, 673, 680, 332; 310/313 R, 313 B, 313 C

(56) References Cited

U.S. PATENT DOCUMENTS 6,278,180 B1 * 8/2001 Mizushima et al. ........ 257/700

2002/0053127 A1 * 5/2002 Uchikoba .................. 29/601

FOREIGN PATENT DOCUMENTS

| JP | 6-97315 | 4/1994 |
| JP | 10-79638 | 3/1998 |

\* cited by examiner

*Primary Examiner*—Deborah Jones
*Assistant Examiner*—G. A. Blackwell-Rudasill
(74) *Attorney, Agent, or Firm*—Oblon, Spivak, McClelland, Maier & Neustadt, P.C.

(57) ABSTRACT

In a surface electrode structure on a ceramic multi-layer substrate having on the surface SAW device mounting surface electrodes for mounting flip chips as surface-acoustic-wave devices by gold-gold bonding and soldered parts mounting surface electrodes. Further, at least the lowermost layer is made of a sintered silver conductor which is partly buried in the ceramic multi-layer substrate, a nickel or a nickel alloy layer being contained as an intermediate layer, and the topmost layer being a gold layer. Thus, a surface electrode structure on a ceramic multi-layer substrate is suitable for both mounting of SAW devices by gold-gold bonding and mounting of other parts by soldering and which enable consistent mounting of individual parts using a ceramic multi-layer substrate to provide higher reliability.

6 Claims, 6 Drawing Sheets

SURFACE ELECTRODE STRUCTURE ON CERAMIC MULTI-LAYER SUBSTRATE AND PROCESS FOR PRODUCING THE SAME

BACKGROUND OF THE INVENTION

The present invention relates to a surface electrode structure on a ceramic multi-layer substrate and a process for producing surface electrodes on the substrate, which can be applied to the production of high-frequency modular parts having soldered surface-mounted parts and flip chip mounted surface-acoustic-wave devices on a ceramic multi-layer substrate and which enable consistent mounting of individual parts to provide higher reliability.

The market always demands smaller electronic equipment and it also demands reduction in the size and weight of the parts used. This tendency is noticeable in high-frequency equipment typified by cellular phones and is particularly pronounced in the parts used. In high-frequency equipment, there has been an increase in the parts mounting density to meet the demand for smaller size and lighter weight. Device mounting substrates are not an exception and in order to meet the demand for smaller size, the substrate having a single conductor layer is mostly replaced by the multi-layer substrate.

The ceramic multi-layer substrate has the insulating layers formed of electrically insulating ceramics and has the conductor layers formed of silver or the like. Compared to the conventional resin multi-layer substrate, the ceramic multi-layer substrate has many advantages including low loss at high frequencies, good heat conduction, as well as high dimensional precision and reliability.

The ceramic multi-layer substrate has a further advantage in that by forming a coil of the internal conductor or parallel plates of it, an inductance or a capacitance can be provided internally. What is more, the low loss and high dimensional precision features enable internal formation of high-Q and small-tolerance devices.

These features are deliberately utilized in cellular phones and other high-frequency circuits as a module or a device assembly of various parts that are mounted on the surface and which also have high characteristics, as well as meet the demand for smaller size.

In the high-frequency module, circuits are grouped by function, so compared to the conventional technique of forming circuits by mounting discrete parts individually, it allows for a simpler equipment structure and can provide equipment of better reliability and characteristics. Speaking further of the conventional discrete parts, their characteristics are combined to perform the intended functions and this results in a complicated design. In modularization, the specifications for the characteristics of each module are predetermined, so equipment design can be structurized and completed in a shorter period with reduced labor.

FIG. 6 is a block diagram for the GSM dual-band cellular phone which is used at the largest number of terminals in the world. In the figure, ANT designates an antenna for transmitting and receiving radio waves, DPX a diplexer (two-frequency switching filter) as a filter to separate two frequencies, T/R SW a transmission/receiving conversion switch as a means of switching between transmission and receiving of radio waves, LPF a low-pass filter as a filter to suppress harmonics at the transmission stage, and BPF a bandpass filter at the receiving stage.

In the illustrated circuit of cellular phone, modularization is realized for several functions and, in a typical case, devices are actually mounted on a multi-layer substrate in the antenna/switch section.

FIG. 7 shows an exemplary module for the antenna/switch section. In the figure, numeral 10 designates a ceramic multi-layer substrate having an inductor portion 11 and a capacitor portion 12 in the interior, as well as an external electrode 13. Chip components 15 such as diodes working as switching elements and resistors are mounted on the ceramic multi-layer substrate 10 and a shield case 16 is provided to cover up the top of the ceramic multi-layer substrate. Note that the module shown in FIG. 7 does not include surface-acoustic-wave devices (hereunder referred to as SAW devices) or they are mounted as packaged parts.

As of today, modularization has been realized in mono-functional devices such as power amplifiers and antenna/switch modules. If a broader range of functions are modularized, the advantages of modularization will be further obtained. Of course, modularization of devices including SAW devices is also important.

Conventional SAW devices have used so-called "packaged" parts. Modularization can of course be realized by mounting packaged parts; however, as will be described later in the present invention, direct mounting of device chips on a substrate is believed to be more effective in realizing smaller and lower profiles, as well as lower cost.

The ceramic multi-layer substrate is characterized by its ability to contain inductance and capacitance as built-in parts to thereby allow for size reduction. On the other hand, lower profiles are difficult to realize. Therefore, common modules having packages mounted on a substrate cannot fully meet the ever increasing demand for lower profiles. In addition, packaged devices will occupy larger areas than the initial bare chips. Among the parts used, SAW devices are of the highest profile and occupy the wider area. Under these circumstances, it is desired that SAW chips be somehow mounted directly on the ceramic multi-layer substrate without using packages.

The production of SAW devices consists of two steps, one for fabricating SAW chips and the other for mounting and sealing them in package, and each step requires similar amounts of cost. If direct mounting on the ceramic multi-layer substrate is possible, inexpensive equipment can also be made in the absence of the step of mounting and sealing SAW devices in package.

As described above, it is desired for high-frequency modules that SAW devices be directly mounted as chips on the ceramic multi-layer substrate and that other parts be mounted by soldering.

To this end, the ceramic multi-layer substrate must be compatible with both the step of flip mounting SAW devices and the step of soldering other parts.

SAW devices are commonly bonded by gold-gold bump bonding with gold (Au) forming the topmost layer of the surface electrodes on the ceramic multi-layer substrate. In bonding by solder, the surfaces of lands on the substrate are commonly made of a tin or solder film, each of which is usually formed by plating.

The soldering process commonly comprises the steps of applying a paste of solder to the lands on the substrate surface, then placing the parts to be soldered, and performing a heat treatment such as reflowing to fix the parts. In this case, the flux in the paste of solder evaporates and the interface with the surface electrodes is activated to secure the wettability by the solder.

In the present invention, it is presupposed that SAW devices are mounted as exposed, so if they are first mounted, their characteristics will be greatly affected by the flux deposited in the subsequent step of soldering other parts. Hence, no method has yet been established that enables both the mounting of SAW devices in a bare state and the soldering of other parts as in the present invention.

The currently available small-size SAW device, as typically disclosed in Unexamined Published Japanese Patent Application (kokai) No. 10-79638/(1998), is fixed to a ceramic substrate or a resin substrate by a method called "flip chip" mounting. This is shown in FIG. 8, in which 20 designates the substrate and 30 a flip chip as the SAW device. Formed on the substrate 20 are electrodes 21 whose surface is made of gold (Au), and the flip chip 30 has gold stud bumps 31 formed on the principal surface having an SAW ladder-shaped electrode. With the SAW ladder-shaped electrode carrying principal surface facing down, the flip chip 30 is flip mounted by gold-gold bonding (face-down bonding).

This method would be effectively adopted in the present invention to mount SAW devices but it must satisfy the condition that no problem occurs if the SAW devices are mounted together with soldered parts. Unlike in the case of modularizing SAW devices alone, assembling a composite module with other parts will increase the thickness of the ceramic multi-layer substrate. In this case, the bonded areas will be subject to a greater stress in ordinary packaged devices.

Unexamined Published Japanese Patent Application (kokai) No. 6-97315/(1994) discloses a prior art case of mounting and sealing SAW devices together with other circuit components. In this prior art case, SAW devices are fixed, with face up, to the resin substrate and electrical connection is established by wire bonding; this is clearly different from the present invention which assumes the flip chip mounting of SAW devices on the ceramic multi-layer substrate. The present invention further achieves size reduction by adopting flip chip mounting. Another difference is that the effect of the thermal expansion difference from the substrate can be reduced by using the "flip chip" morphology. According to Unexamined Published Japanese Patent Application (kokai) No. 6-97315/(1994), supra, the ceramic substrate has a thermal expansion difference and is therefore problematic but in the present invention, the effect at issue is extremely attenuated. In particular, the temperature coefficient of SAW device and the thermal expansion difference cancel each other and if one compares the temperature characteristics of center frequency for the flip chips mounted on the resin substrate and the ceramic substrate, the result is better with the ceramic substrate as FIG. 5 shows.

It first appears that Unexamined Published Japanese Patent Application (kokai) No. 6-97315/(1994), supra, teaches the mixed mounting of SAW devices with other passive components but it does not presuppose the mixed mounting with parts to be soldered as in the present invention. For the sealing purpose, solder is used in the patent and for that matter, simultaneous heating is proposed to avoid contamination with the flux. In other words, it is suggested that mixed mounting with soldered parts is extremely difficult to realize.

The above statements dictate the attainment of two objects. One is to provide an electrode structure that can establish connection in both the soldering step and the step of mounting SAW flip chips, and the other is to develop a process flow that will not cause any effect on either step. Speaking of the process flow, soldered parts are first mounted and then the flux on the surfaces where SAW devices are to be mounted is removed by dry etching or the like and this enables the mounting of the SAW devices.

The present invention is particularly directed to the first object, i.e. providing an improved electrode structure. To attain this object, the following problems have to be solved.

(1) Providing the topmost layer which is made of such a material in such a structure that it is suitable for both gold-gold bonding and bonding by solder.

(2) Permitting consistent gold-gold bonding by forming electrodes that have small differences in height and which have a smaller number of surface asperities.

SUMMARY OF THE INVENTION

The present invention has been accomplished under these circumstances and has as objects providing a surface electrode structure on a ceramic multi-layer substrate and a process for producing surface electrodes on the substrate that are suitable for both mounting of SAW devices by gold-gold bonding and mounting of other parts by soldering and which enable consistent mounting of individual parts using a ceramic multi-layer substrate to provide higher reliability.

Other objects and novel features of the present invention will become apparent in the following description of modes of carrying out the invention.

To attain the above-stated objects of the invention, according to first aspect of the present invention, it is provided a surface electrode structure on a ceramic multi-layer substrate having surface SAW device mounting surface electrodes for mounting surface-acoustic-wave devices by gold-gold bonding and soldered parts mounting surface electrodes, in that the lowermost layer is made of a sintered silver conductor which is partly buried in the ceramic multi-layer substrate, an intermediate layer made of a nickel or a nickel alloy layer, and a topmost layer made of a gold layer.

Further, according to the second aspect of the invention, the intermediate layer of the nickel or nickel alloy layer has a thickness of 1 $\mu$m–10 $\mu$m and that the topmost layer of the gold layer has a thickness of 0.3 $\mu$m–3 $\mu$m.

Further, according to third aspect of the invention, the sintered silver conductor has a thickness of 10 $\mu$m–40 $\mu$m and that a depth of said sintered silver conductor by which it is buried in said ceramic multi-layer substrate is 60%–95% of the thickness of said sintered silver conductor.

Furthermore, according to the fourth aspect of the invention, the SAW device mounting surface electrodes have a gap in height of no more than 3 $\mu$m.

Moreover, according to the fifth aspect of the invention, it is provided a process for producing surface electrodes on a ceramic multi-layer substrate having surface SAW device mounting surface electrodes for mounting surface-acoustic-wave devices by gold-gold bonding and soldered parts mounting surface electrodes, the process comprising the steps of: pressing a unbaked ceramic multi-layer substrate coated with a paste of silver conductor and then baking the ceramic multi-layer substrate to form the lowermost layer of sintered silver conductor which is partly buried in the ceramic multi-layer substrate; forming a nickel or a nickel alloy layer as an intermediate layer by electroless plating; and forming a gold layer as the topmost layer by electroplating or electroless plating.

(1) To meet the need for providing the topmost layer which is made of such a material in such a structure that it is suitable for both gold-gold bonding and bonding by solder, the topmost layer of the surface electrodes may be formed of gold. Note that gold having a purity of at least 99.99% is desirably used in gold-gold bonding in order to provide better adhesion upon application of ultrasonic wave. This pure gold has high wettability with solder and is also suitable as surface electrodes for soldered parts. However, the pure gold is soft and is so susceptible to erosion by molten solder that it sometimes fails to maintain the electrode shape.

Turning to the ceramic multi-layer substrate, sintered silver is commonly used as the surface conductor on it. To ensure good adhesion to the ceramic material, a small amount of glass is added to the sintered silver. The sintered silver was initially a powder from which the particles have been grown, so it inevitably has low surface smoothness. It is also poor in bondability to gold and wettability with solder, which are two requirements to be met by the electrode structure the invention intends to provide.

One may think that these problems can be easily solved by adopting a dual structure consisting of the sintered silver conductor and the gold layer but the adhesion between silver and gold is poor and depending on conditions, silver is also susceptible to erosion by solder and the asperities in the underlying layer cannot be absorbed by gold alone, thus making it difficult to perform consistent bonding of gold bumps. Because these and other problems remain, the dual structure is not a practically feasible approach.

These problems can be solved by sandwiching a suitable thickness of nickel layer or nickel alloy layer between silver and gold. A nickel layer or a nickel alloy layer can be deposited in a fairly large thickness by, for example, plating and adheres very well to both silver and gold. In addition, they are not eroded by solder and can absorb asperities in the surface of the sintered silver conductor.

Great improvement can be achieved by pressing or otherwise planarizing the sintered silver conductor before sintering. If the sintered silver conductor is partly buried in the ceramic sinter by pressing, the adhesion between the ceramic substrate and the sintered silver conductor can be improved.

(2) As for the need to reduce the difference in height between surface electrodes on the substrate in order to perform consistent gold-gold bonding, the following can be said. To form the sintered silver conductor, a paste of silver is usually formed on the ceramic multi-layer substrate by screen printing. In this case, the coating weight of the paste varies with the size of the patterns provided on the screen and it tends to become thicker as the pattern size increases. If there is a difference in height between surface electrodes, defective bonding will occur between the gold bumps on the SAW device and the surface electrodes.

This problem can most effectively be dealt with by planarization of the initial sintered silver conductors and the difference in height that remains after sintering can be absorbed most noticeably as will be described later. The difference in height also tends to increase by plating.

In order to cover asperities in the surface of the silver, a nickel plate of about 5 μm is sometimes deposited; in this case, the thickness of plate deposit has to be prevented from varying between patterns. To this end, electroless plating is particularly suitable.

Speaking now of gold, it is deposited in small thickness, so there is no particular problem if a specified film thickness is ensured; nevertheless, deposition of a thin film will lead to cost saving and to this end, electroless plating is again preferred.

According to the present invention, all of these problems can effectively be solved.

BRIEF DESCRIPTION OF THE PREFERRED EMBODIMENTS

DETAILED DESCRIPTION OF THE PREFERRED EMBODIMENT

On the pages that follow, modes for carrying out the present invention as it relates to a surface electrode structure for a ceramic multi-layer substrate and to a process for producing surface electrodes on the substrate are described with reference to accompanying drawings.

Figure 1A:
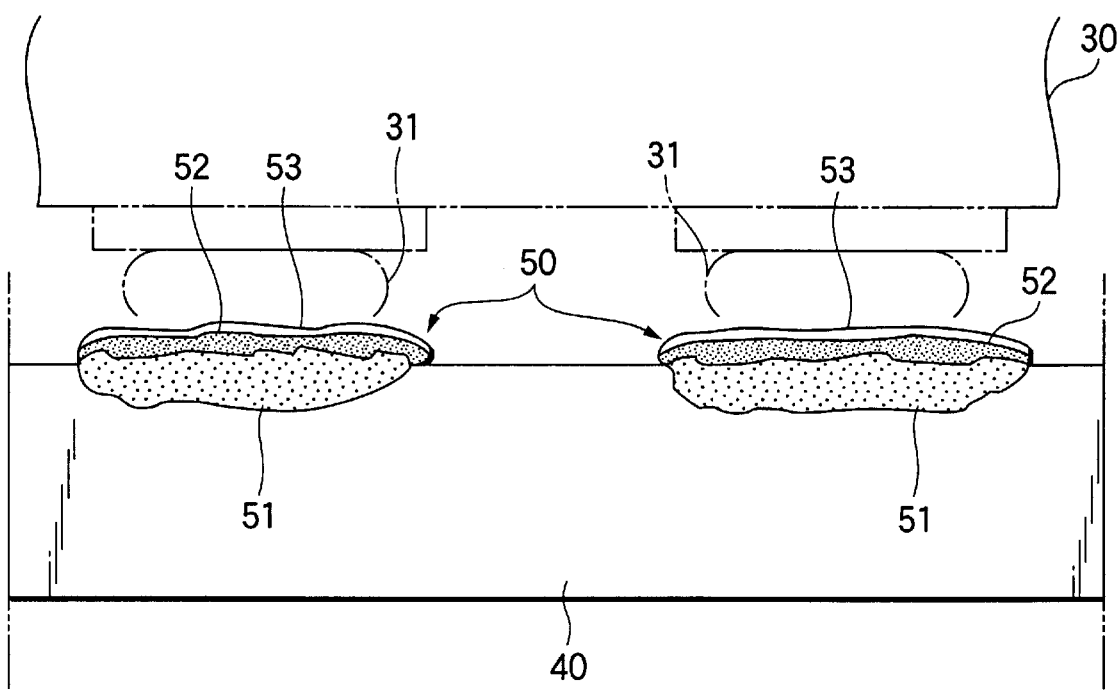
FIG. 1A shows a section view of a surface electrode structure on a ceramic multi-layer substrate according to an embodiment of the invention.
Figure 1B:
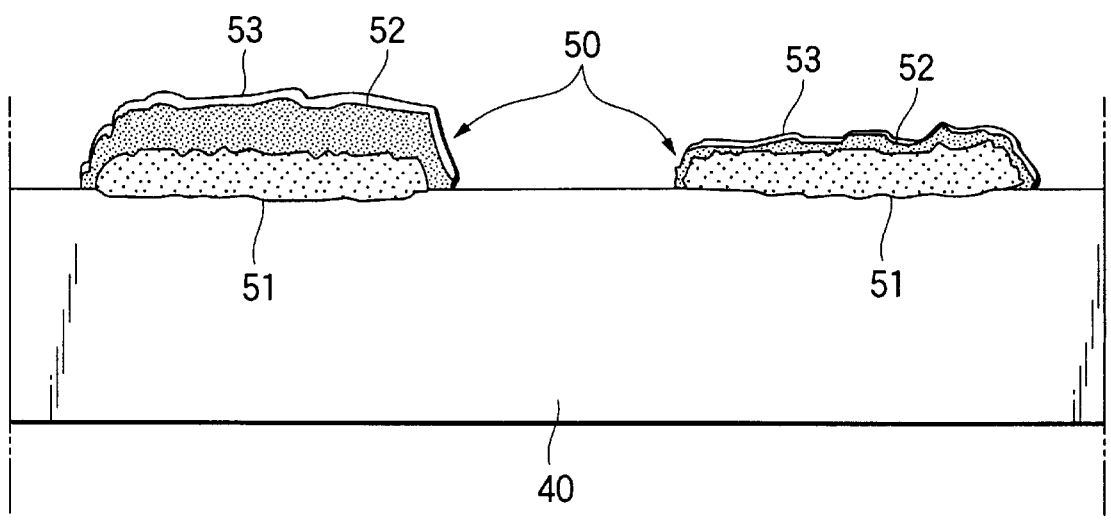
FIG. 1B shows a section view of a comparative example.
Figure 2A:
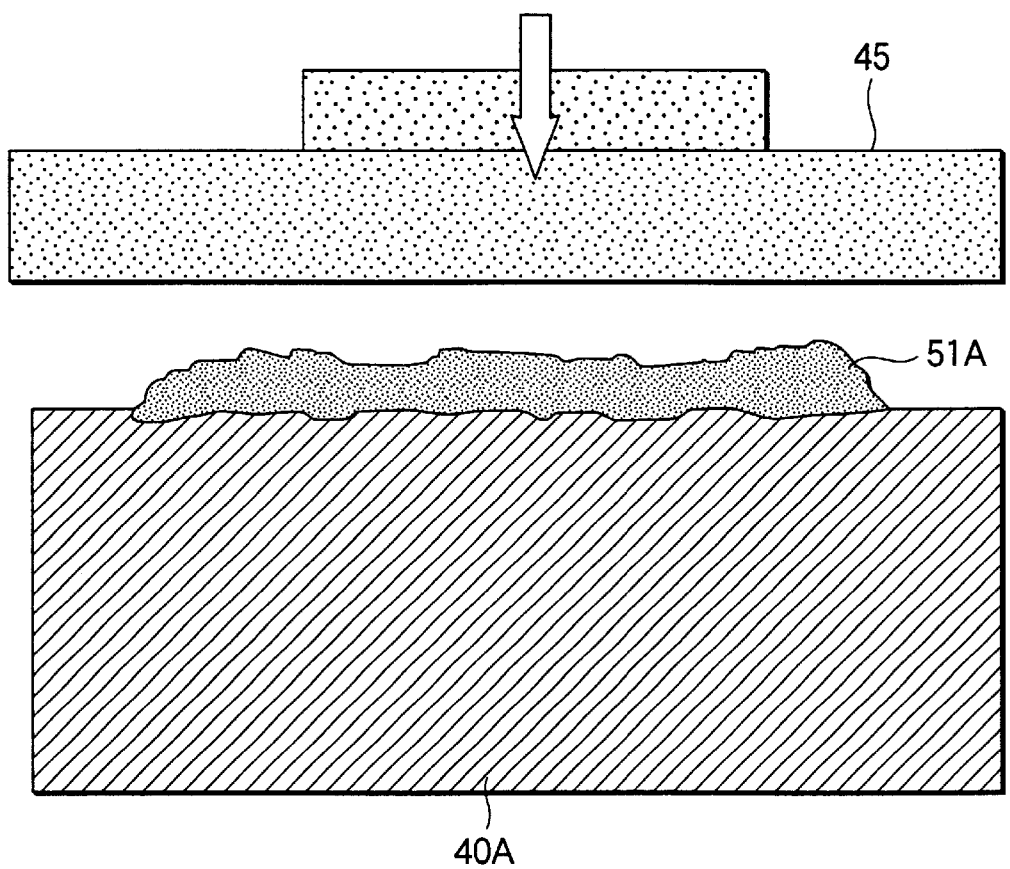
FIGS. 2A and 2B illustrate steps in the process of pressing a ceramic multi-layer substrate coated with a silver conductor paste prior to baking.
Figure 2B:
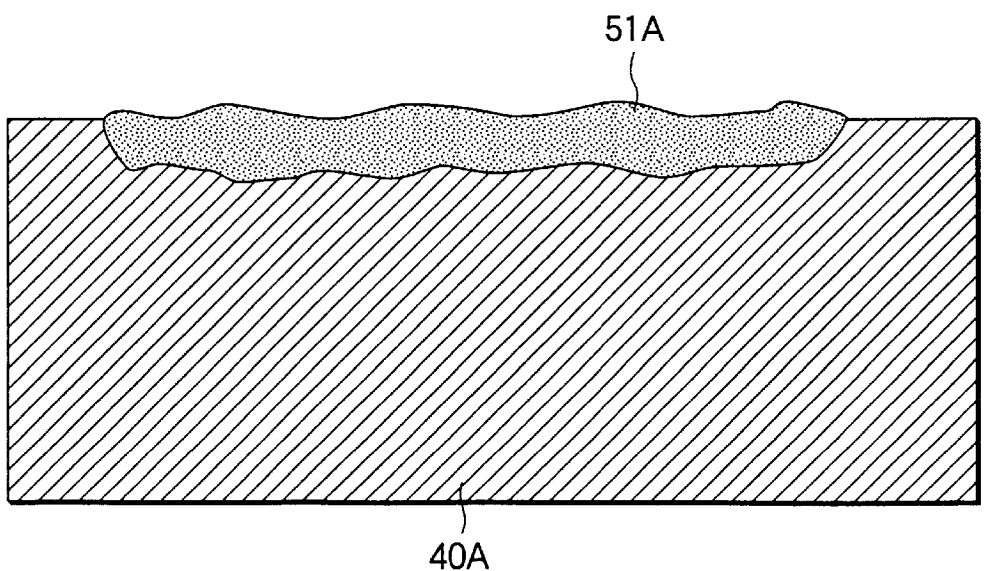
Figure 3:
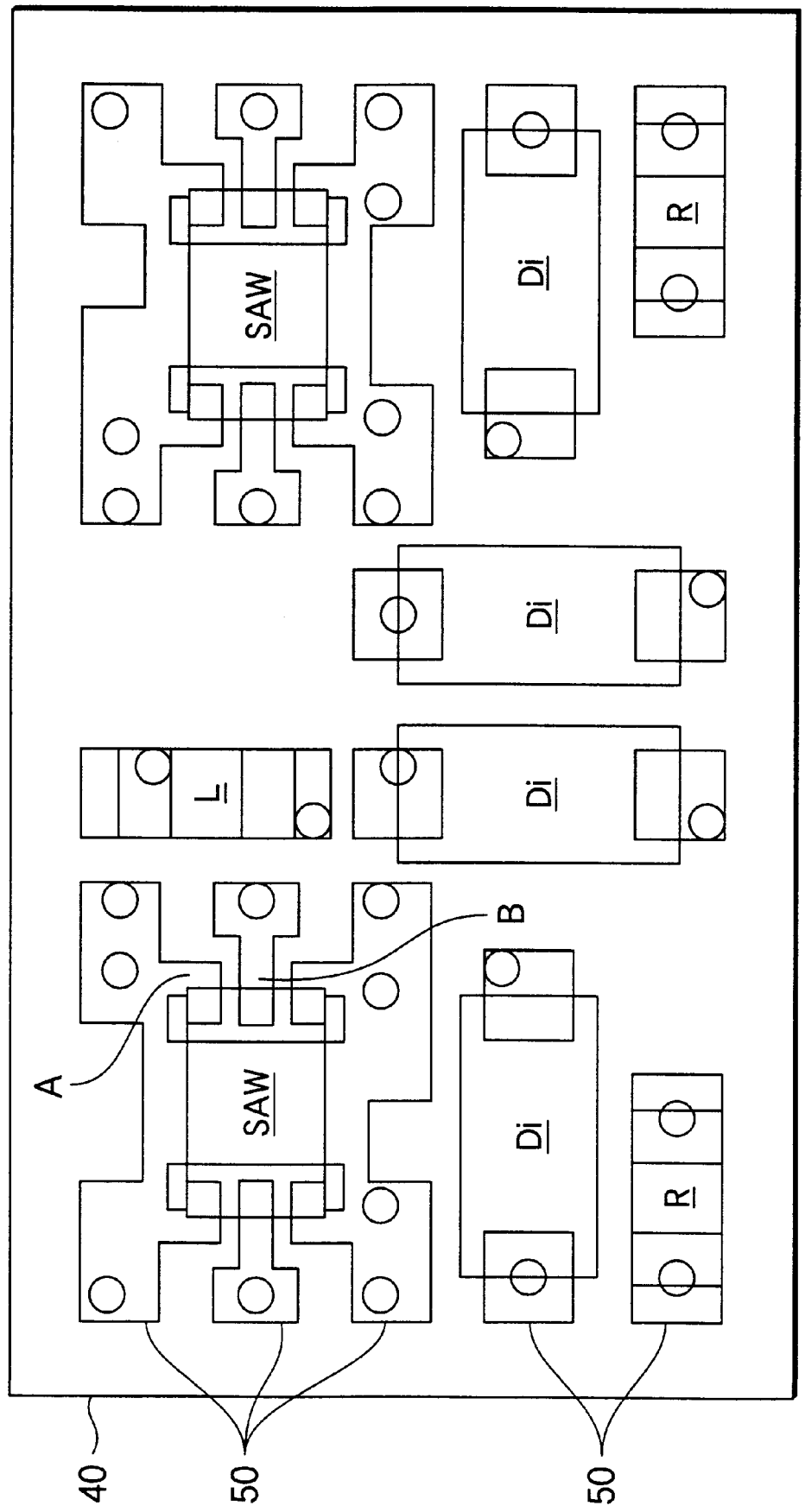
FIG. 3 is a plan view showing an exemplary surface electrode pattern and parts layout for fabricating a high-frequency modular part in the embodiment of the invention.
Figure 4:
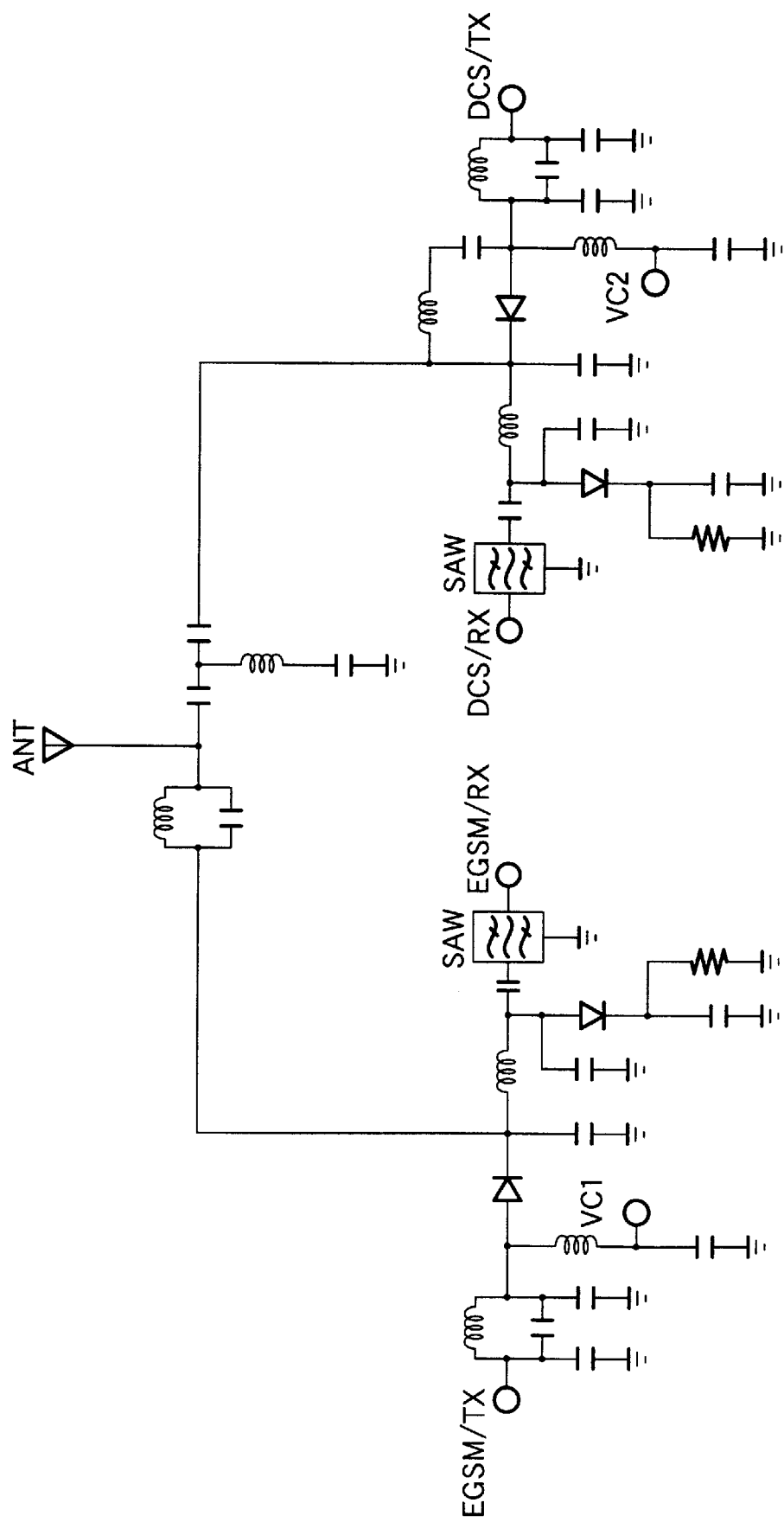
FIG. 4 is a circuit diagram for the high-frequency modular part.

FIG. 1A shows a mode for carrying out the invention as it relates to a surface electrode structure on a ceramic multi-layer substrate used to fabricate a high-frequency modular part including a SAW device, and it should be compared with the comparative surface electrode structure shown in FIG. 1B. FIGS. 2A and 2B show steps in the process of planarizing a surface electrode in the mode of carrying out the invention; FIG. 3 shows surface conductor patterns and parts layout in the case of fabricating a high-frequency modular part including SAW devices; and FIG. 4 is a circuit diagram for the high-frequency modular part.

In FIG. 1A, reference numeral 40 designates a ceramic multi-layer substrate which in the case under consideration used an alumina glass composited ceramic material in the insulating layer and 15 internal conductor layers (not shown). The outside dimensions of the ceramic multi-layer substrate were about 6 mm×4 mm and 0.8 mm in thickness. The patterns of the surface conductor layers, namely, surface electrodes 50, on the ceramic multi-layer substrate 40, as well as positions for the mounting of SAW devices, diodes Di, resistors R, inductor L, etc. are shown in FIG. 3.

The surface electrodes 50 on the ceramic multi-layer substrate 40 have the lowermost layer formed of a sintered silver conductor 51. As shown in FIG. 2A, a yet-to-be baked ceramic/silver dual layer 40A which will serve as the ceramic multi-layer substrate 40 is coated by screen printing with a silver conductor paste 50A which is to be sintered to produce a sintered silver conductor; a press plate 45 is urged against the coated surface to apply pressure so that it is planarized as shown in FIG. 2B. Thereafter, the ceramic/silver dual layer 40A and the silver conductor paste 50A are baked simultaneously to produce the ceramic multi-layer substrate 40 having the sintered silver conductor 51 partly buried in it.

After baking the ceramic multi-layer substrate 40, the thickness of the sintered silver conductor 51 is preferably adjusted to be within the range of 10 μm–40 μm so that the depth by which the sintered silver conductor 51 is buried in the ceramic multi-layer substrate 40 is set within the range of 60%–95% of the thickness of said silver sinter 51.

The relationship between the state of burial of the sintered silver conductor 51 after baking, the gap (difference in height) between sintered conductors 51 and the state of surface roughness as a function of the pressure being applied in the pressing step will be described later in connection with the explanation of Table 1.

As shown in FIG. 1A, the ceramic multi-layer substrate 40 having the sintered silver conductor 51 to form the lowermost layer is provided with a nickel or nickel alloy layer 52 which is formed in a specified film thickness by electroplating or electroless plating as an underlying plate that serves as the intermediate layer (as will be mentioned later, electroless plating is preferred).

Thereafter, a gold film that serves as a gold layer 53 to form the topmost layer is formed in a specified film thickness by electroplating or electroless plating.

As a result, surface electrodes 50 each consisting of the sintered silver conductor 51 (lowermost layer), the nickel or nickel alloy layer 52 (intermediate layer), and the gold layer 53 are formed on the ceramic multi-layer substrate 40.

To mount soldered parts on the ceramic multi-layer substrate 40 having the above-described surface electrode structure, a paste of solder is applied to those areas of the surface electrodes 50 which are to be subjected to bonding by solder and respective parts such as inductors, capacitors, diodes and resistors are mounted and subsequently passed through a reflow furnace to fix the solder. Thereafter, plasma cleaning is performed to remove the flux from the SAW device mounting surfaces where SAW devices are to be subsequently mounted.

Figure 8:
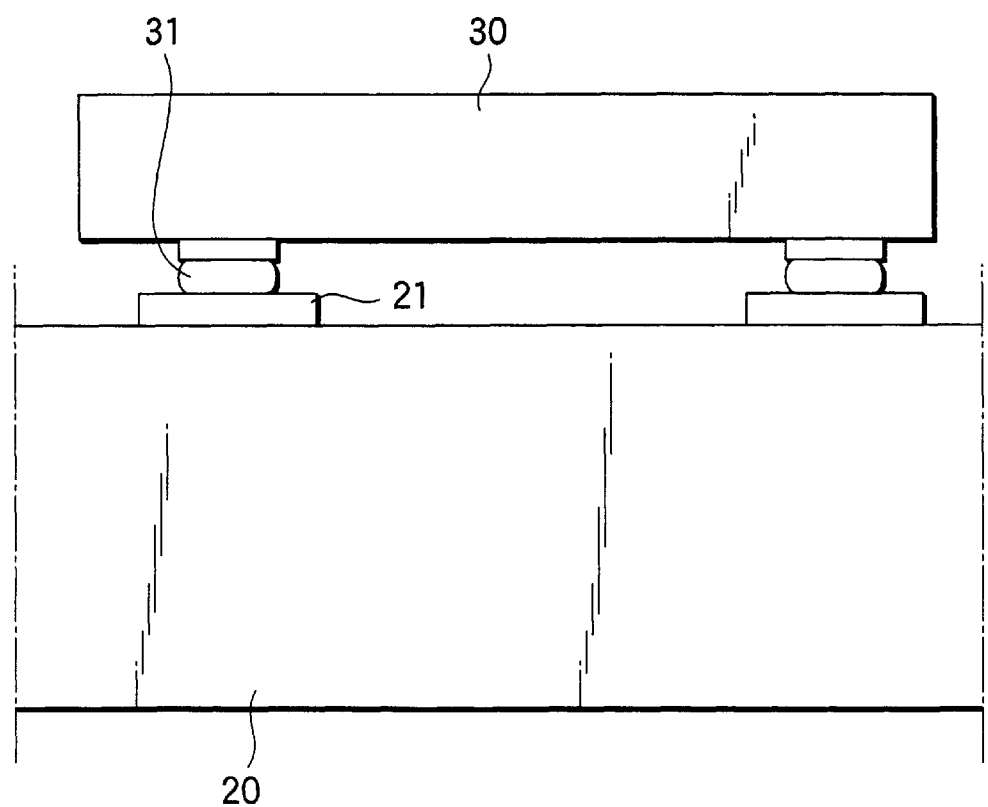
FIG. 8 is a front view showing how a SAW device is face-down bonded (flip chip mounted) by gold-gold bonding.

To mount SAW devices, they are subjected to flip mounting by gold-gold bonding (by the gold ball bonding method). The SAW devices to be mounted are not packaged devices but flip-chip mountable SAW devices, or flip chips one of which is indicated by 30 in FIG. 8 as a bare chip. The flip chip 30 is produced by the same process as for packaged devices and has gold stud bumps 31 formed on the principal surface where a SAW ladder-shaped electrode is formed (thus, the second half of the process for fabricating packaged devices which comprises the steps of mounting and sealing in package is omitted). Then, onto the surface electrodes 50 on the ceramic multi-layer substrate 40, the flip chip 30 is flip mounted by gold-gold bonding (face-down bonding) with the principal surface (carrying the SAW ladder-shaped electrode) facing down. In FIG. 1A, the flip chip 30 which is to be mounted on the surface electrodes 50 is indicated by an imaginary line. The face-down bonding of the flip chip 30 was performed as follows: the flip chip 30 was placed, with its face down, in a predetermined position on the ceramic multi-layer substrate 40 and ultrasonic waves of 9 W were applied for 0.6 seconds from above the flip chip 30 with a load of 300 g being applied simultaneously so that the gold stud bumps 31 were bonded to the gold surfaces of the surface electrodes 50 on the substrate by ultrasonic bonding.

The relationship between the type of plating on the surface electrodes 50, its thickness, gap and side press strength will be described later in connection with the explanation of Table 2. For the measurement of the data in Tables 1 and 2, cross-sectional examination was made by an electron microscope.

In the embodiment under consideration, parts such as diodes Di, resistors R and inductor L (see FIG. 3) were soldered to the ceramic multi-layer substrate 40 and flip chips 30 as SAW devices were face-down bonded to fabricate a high-frequency modular part of the circuit shown in FIG. 4. Its outside dimensions were about 6 mm×4 mm and 1.5 mm in height.

The circuit shown in FIG. 4 except the SAW devices is already available in module on the market and also sized about 6 mm×4 mm. According to the present invention, two SAW devices can be mounted on a module of the same size, which is another sufficient evidence to show that size reduction can be realized by the invention. The modular part in the embodiment under consideration was 1.5 mm high and compared to the case of simply mounting a packaged SAW device on the conventional product (which was a module having soldered parts mounted on the ceramic multi-layer substrate), satisfactory lower profiles could be realized.

Figure 5:
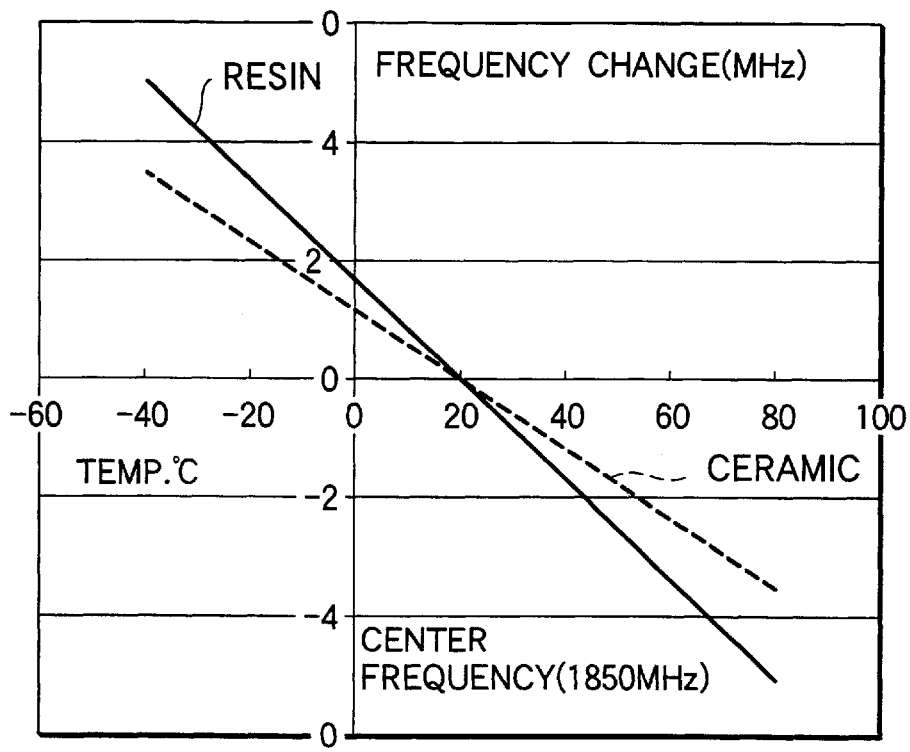
FIG. 5 is a characteristic diagram showing the temperature characteristics of SAW devices mounted on a ceramic substrate and a resin substrate.
Figure 6:
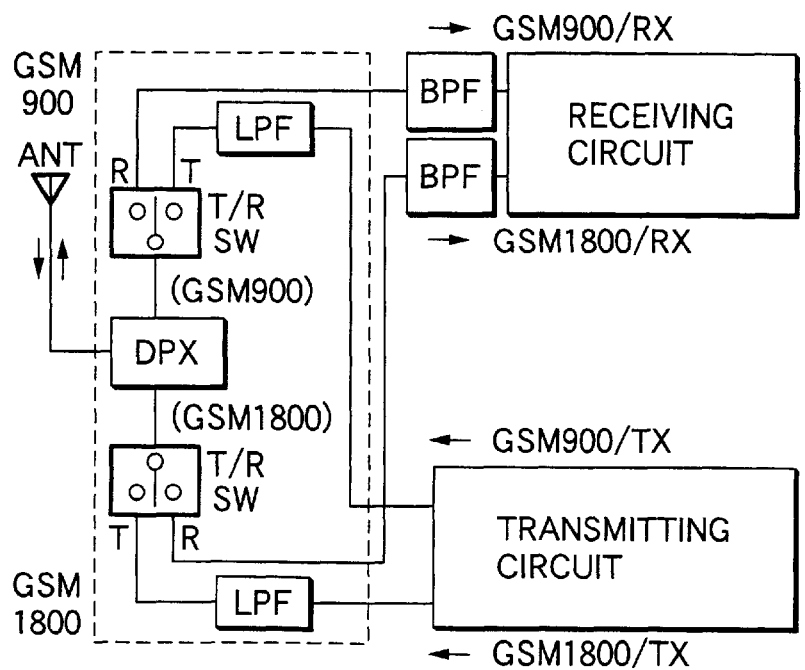
FIG. 6 is a block diagram for the high-frequency circuit in a GSM dual-band cellular phone.
Figure 7:
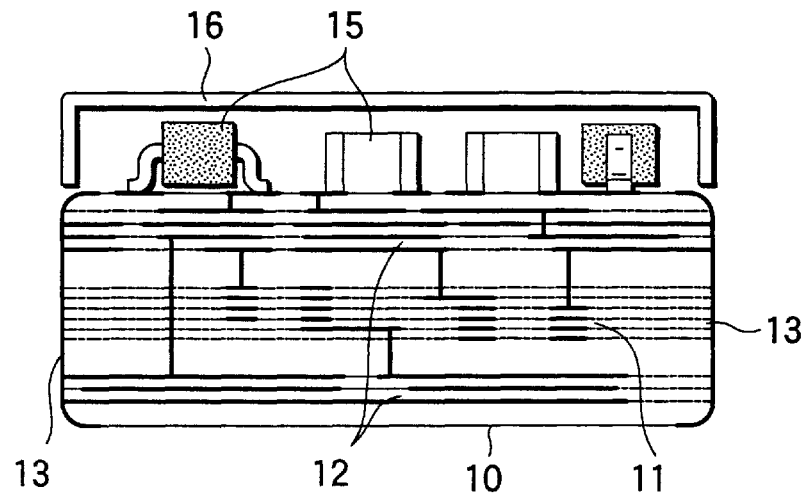
FIG. 7 is a front sectional view of a front-end module including an antenna/switch section.

FIG. 5 shows the temperature characteristics of center frequency for two cases, one of mounting flip chips of SAW device on the ceramic substrate as in the embodiment under consideration (and indicated by the dashed line) and the other of mounting similar flip chips on the resin substrate (and indicated by the solid line). Obviously, the ceramic multi-layer substrate experiences the smaller change in frequency with temperature.

The thickness of the sintered silver conductor 51 which formed the lowermost layer of the surface electrodes 50 on the substrate 40 was varied at 10 μm, 30 μm and 40 μm., and the pressure applied was also changed so that the amount by which the conductor 51 was buried in the substrate 40 would vary from 50% to 100%. The thus prepared samples were measured for the gap (difference in height) between conductors 51 and the surface roughness, and the results are shown in Table 1 below. The conductor pattern used is shown FIG. 3 and the points of actual measurements were A and B, which correspond to the actual points of contact with the gold bumps.

TABLE 1

Amount of burial of silver conductors, their gap, and surface roughness

| Conductor thickness (μm) | Amount of burial (%) | Gap (μm) | Surface roughness (μm) | Remarks |
| --- | --- | --- | --- | --- |
| 10 | 50 | 12 | 9 | |
| | 60 | 2 | 6 | |
| | 70 | 2 | 5 | |
| | 80 | 2 | 5 | |
| | 90 | 1 | 5 | |
| | 95 | 1 | 5 | |
| | 100 | 1 | 3 | Cracked |
| 30 | 50 | 11 | 11 | |
| | 60 | 3 | 7 | |
| | 70 | 3 | 6 | |
| | 80 | 2 | 6 | |
| | 90 | 1 | 5 | |
| | 95 | 1 | 5 | |
| | 100 | 1 | 4 | Cracked |
| 40 | 50 | 10 | 15 | |
| | 60 | 3 | 8 | |
| | 70 | 3 | 5 | |
| | 80 | 2 | 5 | |

TABLE 1-continued

Amount of burial of silver conductors, their gap, and surface roughness

| Conductor thickness ($\mu$m) | Amount of burial (%) | Gap ($\mu$m) | Surface roughness ($\mu$m) | Remarks |
|---|---|---|---|---|
| | 90 | 1 | 4 | |
| | 95 | 1 | 5 | |
| | 100 | 1 | 4 | Cracked |

If the pressing step shown in FIG. 2 is omitted, the sintered silver conductor 51 in the lowermost layer is not buried as in the comparative example shown in FIG. 1B and, as a result, the gap between surface electrodes 50 increases and so does the surface roughness. On the other hand, if the sintered silver conductor 51 in the lowermost layer is partly buried in the substrate 40 by the pressing step, the gap decreases and so does the surface roughness as shown in Table 1. The gap data in Table 1 varies greatly with the subsequent plating step but it is generally desired that the gap be held to be no greater than about 3 $\mu$m at this stage. The surface roughness can also be reduced by the subsequent plating step but it is desirably held to be no greater than about 5 $\mu$m. Irrespective of whether the sintered silver conductor 51 has a conductor thickness of 10 $\mu$m, 30 $\mu$m or 40 $\mu$m, there exist ranges that satisfy the gap and surface roughness requirements. It should, however, be noted that for the 10 $\mu$m–40 $\mu$m range of the conductor thickness of the sintered silver conductor 51, if the amount of burial is less than 60%, slight improvements on the gap and surface roughness are achieved compared to the case of omitting the pressing step but the improvement is by no means marked. If the amount of burial exceeds 95%, cracking occurred at the interface with the ceramics upon baking. The desired range for the amount of burial is between 60% and 95% and the range of 80%–90% is particularly preferred.

Discussion is next made about nickel plating. To compare electroplating with electroless plating, sintered silver conductors 30 $\mu$m thick that were buried by 95% were actually plated for different periods of time.

When electroplating was applied, the thickness varied greatly with the site of electrodes and the thickest area had to be at least 3 $\mu$m in order to cover the entire surface. As will be mentioned later, a nickel layer with a thickness of at least 2 $\mu$m is desired in order to absorb the asperities in the sintered silver conductor 51 but, on the other hand, the thickest area had to be 6 $\mu$m thick in order that the thinnest area would be 2 $\mu$m thick; this eventually produced gaps of about 4 $\mu$m.

When electroless plating was applied, the gap was such that the thinnest area was about 3 $\mu$m thick even when the thickest area was 5 $\mu$m thick. It was therefore found that for the purposes mentioned above, nickel is desirably deposited by electroless plating.

A broad class of NiP and NiB systems are known for the electroless plating of nickel and in the embodiment under consideration, Ni plating in "the broad sense" is meant and each system is of course included.

Table 2 below shows the relationship between the types of nickel and gold plates, their thickness, inter-electrode gap, shear strength and the result of thermal impact test.

TABLE 2

Relationship between plate type, plate thickness, gap and shear strength (Sintered silver conductor: thickness, 30 $\mu$m; amount of burial, 90%)

| Plate type and thickness ($\mu$m) | | Gap ($\mu$m) | Surface roughness ($\mu$m) | Shear strength (gf) | Failure in thermal impact test (among 100 pcs) | Remarks |
|---|---|---|---|---|---|---|
| nonelectroplated Ni | nonelectroplated Au | | | | | |
| 0.5 | 0.5 | 1 | 5 | 320 | 25 | great surface roughness |
| 1 | 0.5 | 1 | 3 | 450 | | |
| 2 | 0.5 | 1 | 2 | 480 | | |
| 3 | 0.5 | 2 | 2 | 500 | | |
| 5 | 0.5 | 2 | 2 | 500 | | |
| 7 | 0.5 | 2 | 1 | 450 | | |
| 10 | 0.5 | 2 | 1 | 400 | | |
| 15 | 0.5 | 3 | 1 | 400 | — | plate spread to cause shorting |
| nonelectroplated Ni | electroplated Au | | | | | |
| 0.5 | 0.5 | 1 | 5 | 300 | 25 | great surface roughness |
| 1 | 0.5 | 1 | 3 | 460 | | |
| 2 | 0.5 | 1 | 2 | 480 | | |

TABLE 2-continued

Relationship between plate type, plate thickness, gap and shear strength (Sintered silver conductor: thickness, 30 μm; amount of burial, 90%)

| Plate type and thickness (μm) | Gap (μm) | Surface roughness (μm) | Shear strength (gf) | Failure in thermal impact test (among 100 pcs) | Remarks |
|---|---|---|---|---|---|
| 3 | 0.5 | 2 | 2 | 480 | |
| 5 | 0.5 | 2 | 2 | 510 | |
| 7 | 0.5 | 2 | 2 | 420 | |
| 10 | 0.5 | 2 | 1 | 400 | |
| 15 | 0.5 | 3 | 1 | — | plate spread to cause shorting |
| nonelectroplated Ni | nonelectroplated Au | | | | |
| 5 | 0.1 | 2 | 2 | 300 | 16 |
| | 0.2 | 2 | 2 | 350 | 10 |
| | 0.3 | 2 | 1 | 450 | 0 |
| | 0.5 | 2 | 1 | 500 | 0 |
| | 0.7 | 1 | 1 | 520 | 0 |
| | 1 | 1 | 1 | 500 | 0 |
| | 2 | 1 | 1 | 510 | 0 |
| | 3 | 1 | 1 | 480 | 1 |
| | 5 | 3 | 5 | 60 | — | Gold plate peel off |
| | 10 | 4 | 4 | 55 | — | Gold plate peel off |

Nickel was nonelectroplated in film thicknesses ranging from 0.5 μm to 15 μm and gold was subsequently electro- or nonelectroplated in film thicknesses ranging from 0.1 μm to 10 μm and the thus prepared samples were subjected to measurements. For measurement of shear strength, gold stud bumps were preliminarily formed on SAW chips, which were placed, with their face down, in predetermined positions on the multi-layer substrate and ultrasonic waves of 9 W were applied for 0.6 seconds from the SAW device side with a load of 300 g being applied simultaneously so that the gold stud bumps were bonded to the gold surfaces of the substrate. In this state, the shear strength of each sample was measured and cross-sectional examination was performed by an electron microscope. The thermal impact test was conducted for clearer description of conditions. In the test, holding on the cold side (−40 ° C.) for 30 minutes and holding on the hot side (85° C.) for 30 minutes were repeated through 100 cycles. For evaluation, the SAW devices mounted on the substrate 40 were measured for insertion loss and samples whose insertion loss increased to more than 5 dB from the initial value of about 2 dB were rated as "failure" and the number of failures in 100 samples was counted.

According to Table 2, substantially smooth surfaces could be realized when nickel was nonelectroplated in thicknesses of at least 1 μm. When the deposit was thicker than 10 μm, the plate spread to cause frequent shorting between patterns. Therefore, the nonelectroplated nickel has preferably a film thickness of 1 μm–10 μm, more preferably 2 μm–5 μm.

When the layer of gold plate was less thicker than 0.3 μm, the gold bonding strength deteriorated considerably and so did the shear strength. Deterioration also occurred beyond 3 μm and the plate came off. Therefore, the range of 0.3 μm–3 μm is preferred. As can be seen, the adhesion in gold-gold bonding (shear strength and thermal impact test) was further stabilized by adjusting the gap to no more than 3 μm or the surface roughness to no more than 3 μm.

According to the embodiment under consideration, the following advantages can be obtained.

(1) In a case like fabricating a modular part of a high-frequency electronic circuit by mounting flip chip mountable SAW devices and solderable parts on the ceramic multi-layer substrate 40, SAW device mounting surface electrodes and soldered parts mounting surface electrodes are each fabricated by superposing in the order written the lowermost layer (sintered silver conductor 51 which is partly buried in the substrate 40), the nickel or nickel alloy layer 52 (intermediate layer) and the gold layer 53 (topmost layer). As a result, an electrode structure can be realized that allows for both the mounting of the flip chip 30 as the SAW device by gold-gold bonding (face-down bonding) and the mounting of solderable parts by soldering; the structure assures not only consistent gold-gold bonding in the SAW device mounting areas but also high mechanical strength and good solder wettability in the solder bonded areas.

(2) By performing plating such that the nickel or nickel alloy layer 52 has a thickness of 1 μm–10 μm and the gold layer 53 has a thickness of 0.3 μm–3 μm, the surface roughness can be reduced and the necessary sufficient shear strength assured while eliminating the occurrence of rejects in the thermal impact test.

(3) Prior to the baking of the ceramic multi-layer substrate 40 and the sintered silver conductor 51, pressing is performed at a specified pressure so that the thickness of the sintered silver conductor 51 is adjusted to be within the range of 10 μm–40 μm and the depth by which the sintered silver conductor 51 is buried in the ceramic multi-layer substrate 40 is 60%–95% of the thickness of the sintered silver conductor 51. As a result, not only the gap (difference in height) between sintered silver conductors 51 in the lowermost layer but also the surface roughness can be reduced. Since this leads to reducing the gap and the surface roughness in the subsequent steps after plating the nickel or nickel alloy layer as the intermediate layer and plating the gold layer as the topmost layer, gold-gold bonding of SAW devices can be accomplished in a satisfactory way.

It should be noted here that the present invention is applicable to modular parts using versatile ceramic multi-layer substrates which require both mounting of SAW devices by gold-gold bonding and mounting of solderable parts by soldering and that the invention is by no means limited to the parts layout shown in FIG. 3 and the circuit confugration shown in FIG. 4.

While the mode for carrying out the invention has been described above, the invention is by no means limited to that particular mode and it will be obvious to the skilled artisan that various modifications and alterations can be made without departing from the scope of the recitations in the claims. For example, similar results can of course be attained if a third plate is formed as an intermediate layer.

As described on the foregoing pages, In a case like fabricating a modular part of high-frequency electronic circuit by mounting flip chip mountable SAW devices and solderable parts on a ceramic multi-layer substrate, SAW device mounting surface electrodes and soldered parts mounting surface electrodes are each fabricated by super-posing in the order written the lowermost layer (sintered silver conductor which is partly buried in the substrate), the nickel or nickel alloy layer (intermediate layer) and the gold layer (topmost layer). As a result, an electrode structure can be realized that allows for both the mounting of ASW devices by gold-gold bonding and the mounting of solder-able parts by soldering; the structure assures not only consistent gold-gold bonding in the SAW device mounting areas but also high mechanical strength and good solder wettability in the solder bonded areas.

What is claimed is:

1. A surface electrode structure on a ceramic multi-layer substrate having surface-acoustic-wave device mounting surface electrodes for mounting surface-acoustic-wave devices by gold-gold bonding and soldered parts mounting surface electrodes for mounting solderable parts by soldering, comprising:
   a lowermost layer made of a sintered silver conductor which is partly buried in the ceramic multi-layer substrate;
   an intermediate layer made of a nickel or a nickel alloy layer; and
   an exposed topmost layer made of a gold layer to be directly gold-gold bonded to said surface-acoustic-wave devices or directly soldered to said solderable parts.

2. The surface electrode structure on a ceramic multi-layer substrate according to claim 1, wherein said intermediate layer made of the nickel or nickel alloy layer has a thickness of 1 $\mu$m–10 $\mu$m and said topmost layer made of the gold layer has a thickness of 0.3 $\mu$m–3 $\mu$m.

3. The surface electrode structure on a ceramic multi-layer substrate according to claim 1, wherein said sintered silver conductor has a thickness of 10 $\mu$m–40 $\mu$m and a depth of said sintered silver conductor by which it is buried in said ceramic multi-layer substrate is 60%–95% of the thickness of said sintered silver conductor.

4. The surface electrode structure on a ceramic multi-layer substrate according to claim 1, wherein said surface-acoustic-wave device mounting surface electrodes have a gap in height of no more than 3 $\mu$m.

5. A surface electrode structure on a ceramic multi-layer substrate having surface-acoustic-wave device mounting surface electrodes for mounting surface-acoustic-wave devices by gold-gold bonding and soldered parts mounting surface electrodes, comprising:
   a lowermost layer made of a sintered silver conductor which is partly buried in the ceramic multi-layer substrate;
   an intermediate layer made of a nickel or a nickel alloy layer; and
   a topmost layer made of a gold layer,
   wherein said sintered silver conductor has a thickness of 10 $\mu$m–40 $\mu$m and a depth of said sintered silver conductor by which it is buried in said ceramic multi-layer substrate is 60%–95% of the thickness of said sintered silver conductor.

6. A surface electrode structure on a ceramic multi-layer substrate having surface-acoustic-wave device mounting surface electrodes for mounting surface-acoustic-wave devices by gold-gold bonding and soldered parts mounting surface electrodes, comprising:
   a lowermost layer made of a sintered silver conductor which is partly buried in the ceramic multi-layer substrate;
   an intermediate layer made of a nickel or a nickel alloy layer; and
   a topmost layer made of a gold layer,
   wherein said surface-acoustic-wave device mounting surface electrodes have a gap in height of no more than 3 $\mu$m.

* * * * *